(12) United States Patent
Yo

(10) Patent No.: US 6,589,885 B2
(45) Date of Patent: *Jul. 8, 2003

(54) SEMICONDUCTOR DEVICE AND METHOD IN WHICH CONTACT HOLE IS FILLED WITH SILICON HAVING LOW IMPURITY CONCENTRATION

(75) Inventor: Shoji Yo, Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/497,861

(22) Filed: Feb. 4, 2000

(65) Prior Publication Data

US 2002/0102789 A1 Aug. 1, 2002

(30) Foreign Application Priority Data

Mar. 12, 1999 (JP) .............................. 11-066686

(51) Int. Cl.$^7$ ........................ H01L 21/31; H01L 21/469
(52) U.S. Cl. .................. 438/758; 438/758; 438/239; 438/243; 438/244; 438/245; 438/250; 438/253; 257/68; 257/71
(58) Field of Search ................................ 438/758, 239, 438/241, 243–45, 250–256; 257/71, 68

(56) References Cited

U.S. PATENT DOCUMENTS

| | | | |
|---|---|---|---|
| 5,032,528 A | * 7/1991 | Asao et al. ................. 437/20 |
| 5,346,844 A | 9/1994 | Cho et al. | |
| 5,412,237 A | 5/1995 | Komori et al. | |
| 5,444,278 A | 8/1995 | Katayama | |
| 5,578,524 A | * 11/1996 | Fukase et al. ............... 437/195 |
| 5,652,168 A | 7/1997 | Komori et al. | |
| 5,652,180 A | * 7/1997 | Shinriki et al. ............. 437/190 |
| 5,821,158 A | * 10/1998 | Shishiguchi ................ 438/528 |
| 5,821,587 A | * 10/1998 | Jeong ......................... 257/355 |
| 5,905,294 A | * 5/1999 | Kushida ..................... 257/409 |
| 5,959,326 A | 9/1999 | Aiso et al. | |
| 6,063,703 A | * 5/2000 | Shinriki et al. ............. 438/653 |
| 6,242,809 B1 | * 6/2001 | Lee ............................. 257/764 |

FOREIGN PATENT DOCUMENTS

| | | | |
|---|---|---|---|
| EP | 0631309 A2 * | 6/1994 | .................. 21/90 |
| EP | 0 734 060 A1 | 9/1996 | |
| JP | 5-218332 | 8/1993 | |
| JP | 5-259405 | 10/1993 | |
| JP | 5-315567 | 11/1993 | |
| JP | 6-21479 | 1/1994 | |
| JP | 7-235616 | 9/1995 | |
| JP | 8-264732 | 10/1996 | |
| JP | 9-246205 | 9/1997 | |
| JP | 9-298278 | 11/1997 | |
| JP | 10-209398 | 8/1998 | |
| JP | 10-294367 | 11/1998 | |

* cited by examiner

Primary Examiner—Matthew Smith
Assistant Examiner—Granville Lee
(74) Attorney, Agent, or Firm—Volentine Francos, PLLC

(57) ABSTRACT

A semiconductor device includes a silicon layer. The silicon layer includes a lower silicon layer and an upper silicon layer which is formed on the lower layer. A concentration of impurities in the upper silicon layer is higher than that of the lower silicon layer.

17 Claims, 10 Drawing Sheets

Fig.6
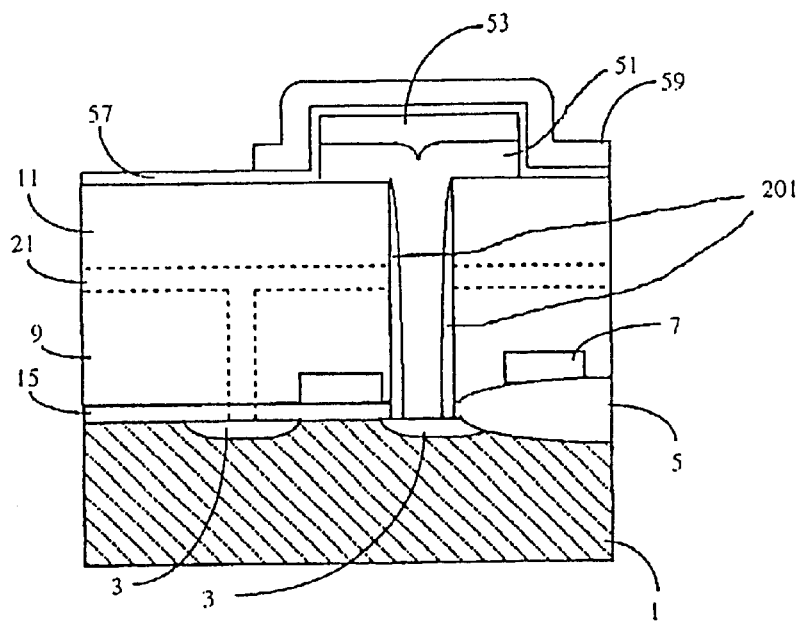
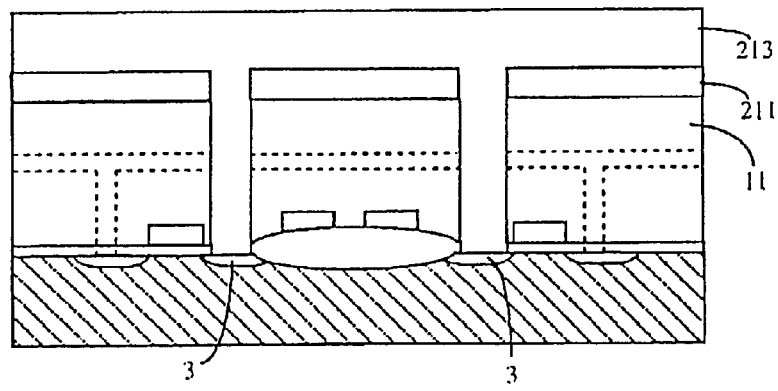
Fig.7(A)
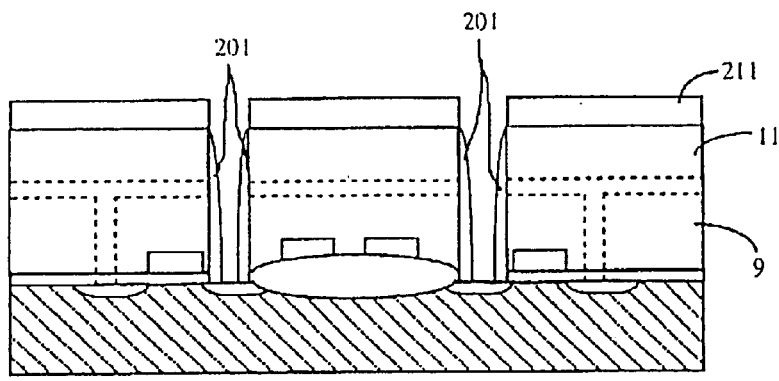
Fig.7(B)

US 6,589,885 B2

SEMICONDUCTOR DEVICE AND METHOD IN WHICH CONTACT HOLE IS FILLED WITH SILICON HAVING LOW IMPURITY CONCENTRATION

FIELD OF THE INVENTION

The present invention relates to a semiconductor device and method of manufacture, and particularly, the present invention relates to a semiconductor memory device having a capacitor which includes a silicon layer having introduced impurities therein, and to a method of manufacturing such a semiconductor memory device.

BACKGROUND OF THE INVENTION

In a semiconductor device, a silicon layer is used in various portions, such as a conductive layer, a resistant element, a gate electrode of transistor, and a capacitor of a memory cell. As is well known, in a Dynamic Random Access Memory (DRAM), a capacitor of the memory cell is comprised of a silicon layer. The silicon layer composes a storage electrode and a cell-plate electrode of the capacitor. A method for manufacturing such capacitors of the DRAM is shown in Japanese Laid Open Patent "Toku-Kai-Hei 7-235616", which was published on Sep. 5, 1995.

In the DRAM of the publication, the silicon storage electrode of the capacitor is composed of a polycrystalline silicon layer and an amorphous silicon layer. Generally, if the silicon layers are applied as the conductive layers, the silicon layers are introduced with an impurity having a high concentration in order to reduce the resistance and maintain good conduction therein. In the polycrystalline silicon layer of the publication, which is connected to diffusion regions (source or drain of transistors) formed in a semiconductor substrate, a conductive impurity having a deep concentration is introduced therein.

In heat treatment processes after forming the storage electrode including the silicon layer which is introduced with the deep impurity, the impurity in the silicon layer is frequently diffused in the semiconductor substrate. The diffused impurity influences an impurity concentration of the diffusion region (source or drain) formed below the storage electrode. Also, the diffused impurity brings an unexpected extension of the diffusion region during the heat treatment after forming the storage electrode.

Therefore, the characteristics of the transistors, typically a threshold voltage of the transistor, is changed to unexpected results.

If an excess of the impurity is introduced into the silicon layer, the impurity can easily diffuse into the semiconductor substrate. As above, the characteristics of the transistors are then influenced.

The smaller the size of the DRAM, the more significant is the leakage current that occurs under a field oxidation layer. Such diffusing of the impurity accelerates the leakage current. Therefore, the date-retention-time may be shorten to less than a predetermined desired date-retention-time.

SUMMARY OF THE INVENTION

An object of the present invention is to provide a semiconductor device which is capable of reducing adverse influences to characteristics of the transistor and securing a predetermined data-retention-time.

Another object is to provide a method of manufacturing such semiconductor device without the addition of many process steps.

To achieve the objects, in a semiconductor device having a silicon, the silicon layer includes a lower silicon layer and an upper silicon layer which is formed on the lower layer, wherein a concentration of impurities in the upper silicon layer is higher than that of the lower silicon layer.

According to the present invention, a semiconductor device is realized which is capable of reducing changes in characteristics of the device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 6 is a cross-sectional view describing a semiconductor device according to a third preferred embodiment.

FIG. 7(A)–FIG. 7(B) are cross-sectional views describing a method of manufacturing the semiconductor device shown in FIG. 6.

DESCRIPTION OF THE PREFERRED EMBODIMENTS

The present invention will be described hereinafter with reference to the accompanying drawings. The drawings used for this description typically illustrate major characteristic parts in order that the present invention will be easily understood. In this description, one embodiment is shown in which the present invention is applied to a DRAM(Dynamic Random Access Memory).

Figure 1:
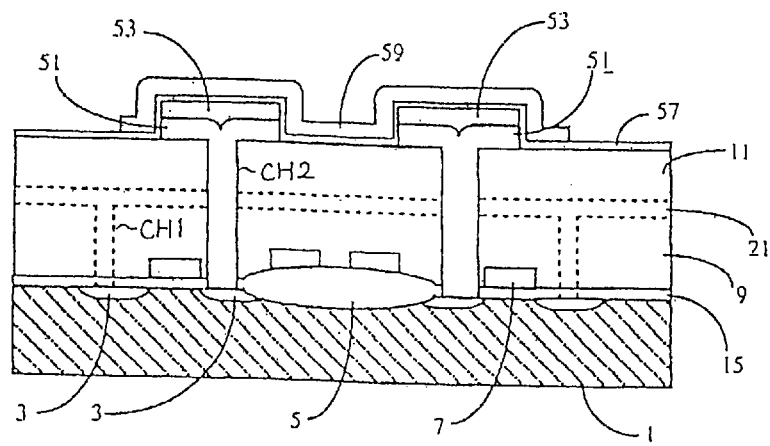
FIG. 1 is a cross-sectional view describing a semiconductor device according to a first preferred embodiment.

FIG. 1 is a cross-sectional view describing a memory cell of the DRAM according to a first preferred embodiment.

N-type diffusion regions 3 (source or drain of a transistor in the memory cell) are formed in a semiconductor substrate 1. A P-type semiconductor substrate or P-type well is used as the semiconductor substrate in this embodiment.

A gate oxide film 15 and a field oxide film 5 which is thicker than that of the gate oxide film 15, are formed in and on the surface of the substrate 1. As is well known, the gate oxide film and field oxide film are an oxidized silicon.

A gate electrode 7 of the transistor of the memory cell is formed on the gate oxide film 15 which is located between the n-type diffusion regions 3. The gate electrode 7 is comprised of polycrystalline silicon.

A first intermediate insulating film 9 is formed on the gate oxide film 15, the field oxide film 5 and the gate electrode 7. The first intermediate insulating layer film 9 is comprised of an oxidized silicon or a BPSG film.

A bit line 21 is formed on the first insulating film 9. This bit line is electrically connected to the diffusion region 3 (one of the source or drain of the transistor in the memory cell) through a contact hole CH1 formed in the first insulating film 9.

A second intermediate insulating layer 11 is formed on the bit line 21. The second intermediate insulating layer film 9 is comprised of an oxidized silicon or BPSG film. A contact hole CH2 is formed to be through the first and second insulating layers 9, 11 and reaches to the diffusion region 3 (the other of the source or drain, which is not connected to the bit line 21).

The capacitor of the first preferred embodiment includes a storage node electrode which is comprised of a first silicon later 51 and a second silicon layer 53, a capacitor dielectric layer which is comprised of a nitride layer 57 and a cell plate electrode which is comprised of silicon layer 59. In this preferred embodiment, the first and silicon layers 51, 53 and the silicon layer 59 are a polycrystalline silicon. Other silicon materials, for example amorphous silicon, can be used as the second silicon layer 53. However, in consideration of the adherence and interaction between the lower layer (the first silicon layer 51) and the upper layer (the second silicon layer 53), the use of polycrystalline silicon is preferable.

The first silicon layer 51 is filled in the contact hole CH2 which is formed in the first and second insulating layers 9 and 11. The first silicon layer 51 extends to the surface of the second insulating layer 11 in the vicinity of the contact hole CH2. The second silicon layer 53 is formed on the first silicon layer 51. Therefore the storage electrode, which is comprised of these silicon layers, is electrically connected to the diffusion region 3 (either the source or drain which is not connected to the bit line 21) through the contact hole CH2.

In order to cover the storage electrode, the nitride layer 57 is formed to extend from the surface of the second insulating layer 11 to the upper surface of the second silicon layer 53 through the side surfaces of the first and second silicon layers 51, 53. The silicon layer 59 is formed on the nitride layer 59 and covers the storage electrode through the nitride layer 57. The silicon layer 59 (cell plate electrode) is patterned in the vicinity of the storage electrode as shown in FIG. 1. Capacitance occurs in the dielectric layer (nitride layer 57) sandwiched between the storage electrode and the cell plate electrode, that is, between the side surface of the first silicon layer 51, the side and upper surfaces of the second silicon layer 53 and the silicon layer 59.

The first silicon layer 51, which forms the lower portion of the storage electrode, is not introduced with an impurity or is introduced with an impurity having a lower concentration than that of the second silicon layer 53. Thus, if an excess of the impurity is introduced into the second silicon layer 53, it is difficult for the impurity to diffuse in the semiconductor substrate since the first silicon layer 51, which is not introduced with an impurity or is introduced with the small concentration of impurity, is arranged between the second silicon layer 53 and the substrate 1. In this embodiment, the impurity is a conductive impurity which provides a conductivity to the silicon layer, for example phosphorus.

Therefore, especially in the DRAM, it is possible to restrain the adverse influences on the date-retention-time.

As mentioned above, the first silicon layer 51 includes no impurities or a small impurity concentration. However, in the case where an impurity is introduced to the first silicon layer 51, the concentration of the impurity may be set within limits. In this case, an upper limit of the concentration is set such that the impurity would not diffuse into the substrate more than a predetermined amount, and the lower limit is set to avoid a reduction in effective capacitance that occurs as the result of the widening of an extremity depletion layer which forms in the lower portion of the storage electrode.

In this embodiment, the lower limit of the lower layer is set at $2 \times 10^{20}/cm^3$ and the upper limit of the lower layer is set at $5 \times 10^{20}/cm^3$. Likewise, the upper layer concentration would be set within upper and lower limits. The upper limit is set such that the impurity would not diffuse into the substrate more than a predetermined amount. In this embodiment, the upper limit is about $5 \times 10^{20}/cm^3$. The lower limit of the upper layer concentration is set to be greater than the concentration of the lower layer, which is this embodiment is at least $2 \times 10^{20}/cm^3$.

Figure 2:
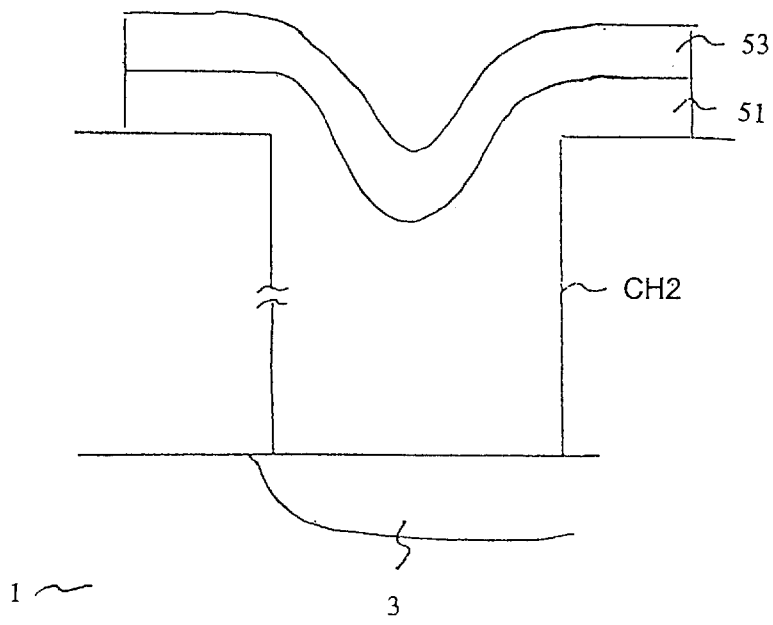
FIG. 2 is a cross-sectional view of a contact hole according to the first preferred embodiment.

According to the FIG. of the storage electrode, another structure can be considered, that is, a part of the second silicon layer 53 is fallen in the contacting hole CH2 shown in FIG. 2. But the longer distance between the second silicon layer 53 including a large impurity and the substrate 1, the more restrainable the diffusion from the second silicon layer 53 to the diffusion region 3. Therefore it is preferable to fill in the contacting hole CH2 with only the first silicon layer 51.

It is preferable to use the same material, for example polycrystalline silicon, according to the first silicon layer 51 and the second silicon layer 53 in order to control the diffusing of the impurity having the high concentration. That is, it is easy to think about the diffusing and expanding of the impurity, if the same material would be used.

A method of manufacturing the semiconductor device described above, will be shown hereinafter referring to FIG. 3. The explanation below will focus on the manufacturing of a capacitor.

Figure 3A:
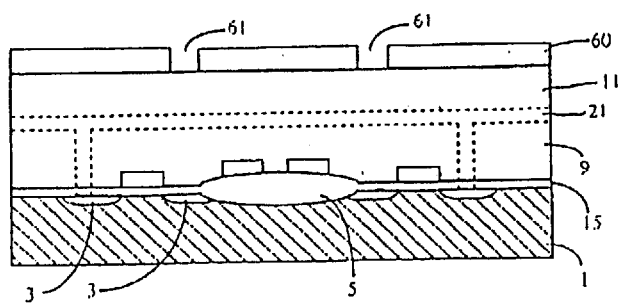
FIG. 3(A)–FIG. 3(H) are cross-sectional views describing a method of manufacturing the semiconductor device shown in FIG. 1.

In FIG. 3(A), the diffusion region 3 is formed on and in the vicinity of the surface of the semiconductor substrate 1. The gate oxide film 15 and the field oxide film 5 are formed on the substrate 1. The field oxide film is formed by a LOCOS method, as is well known, and has a thickness within 2000–5000 Å. Conductive lines used as the gate electrodes 7 are formed on the gate oxide film 15 and the field oxide film 15. The gate electrodes 7 are used as word lines of the DRAM, otherwise they are connected with word lines formed by another process. The first and second intermediate insulating layers 9 and 11 are formed on and above the gate oxide film 15, the field oxide film 5 and the gate electrode 7. The first and second insulating layers 9 and 11 are formed by a CVD method, as is well known, and both have a thickness within 1000–5000 Å. The bit line 21 is formed between the first and second insulating layers 9 and 11. A resist layer 60 is formed on the second insulating layer 11. The layer 60 has openings 61 which correspond to locations at which the storage electrodes will be later formed.

Figure 3B:
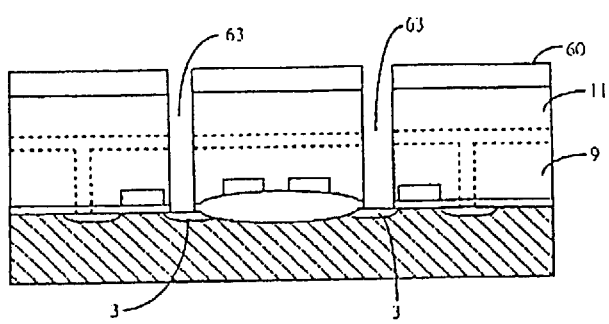

In FIG. 3(B), a part of the first and second insulating layers 9, 11 and the gate oxide film 15 are etched by a photo-etching technique using the resist layer 60 as a mask. So, a contact hole 63 (aforesaid "CH2") is formed which reaches the diffusion region 3. That is, a part of the diffusion region 3 is exposed. This contact hole 63 is often called a "cell-contact".

Figure 3C:
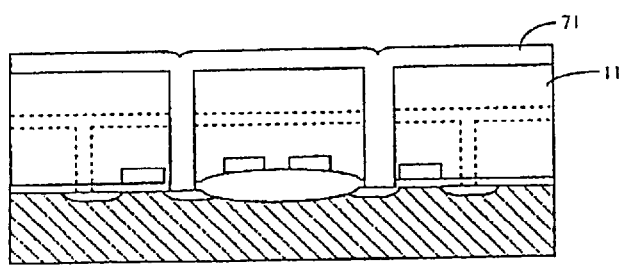

In FIG. 3(C), a polycrystalline layer 71 is deposited to fill in the contact hole 63 and on the second insulating layer 11 suing a CVD method. Preferably, the thickness of the polycrystalline layer 71 is equal to or more than a radius of the contact hole 63.

It is possible to advance to the next step without introducing an impurity into the polycrystalline silicon 71. However, in this embodiment, an impurity at a concentration which is lower than that of a polycrystalline layer 81 mentioned below is introduced to the polycrystalline silicon 71. Phosphorus(P) is used as the impurity in this embodiment. The concentration of the phosphorus is within $2\times10^{20}/cm^3$–$5\times10^{20}/cm^3$. An ion implantation method is used to introduce the impurity and then, an anneal process is carried out for about thirty minutes in a $N_2$ atmosphere at 850° C. The anneal process activates the impurities introduced into the polycrystalline layer silicon 71. Thus, the polycrystalline layer silicon 71 becomes conductive.

Also, it is possible to deposit a polycrystalline silicon which has been introduced with an impurity in advance. Such deposition can be realized using a LPCVD (Low Pressure Chemical Vapor Deposition) method. If this method is used, separate steps of impurity introduction and annealing could be omitted.

Figure 3D:
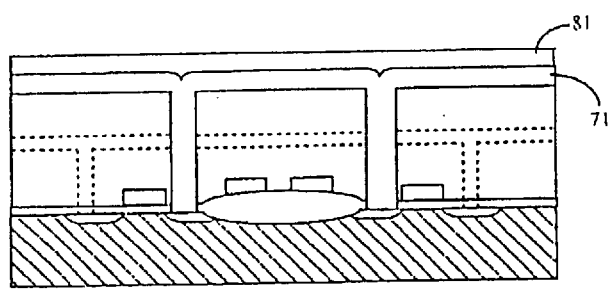

Then, a polycrystalline silicon layer 81 is formed on the polycrystalline silicon layer 71 as shown in FIG. 3(D). An impurity introduced in the polycrystalline silicon 81 is phosphorus (P). A concentration of this impurity is higher than that of the polycrystalline silicon layer 71. The introduction of impurities is carried out by an ion implantation method. An anneal process is then carried out for about thirty minutes in a $N_2$ atmosphere at 850° C. for activation of the impurity. Thus, the polycrystalline layer 81 becomes conductive. A single anneal process can be used to activate both the polycrystalline silicon layers 71 and 81 as the same time. So, the anneal of the polycrystalline silicon layer 71 may be omitted. Likewise as with the layer 71, it is possible to deposit a polycrystalline silicon layer 72 which has been introduced with impurities in advance.

Figure 3E:
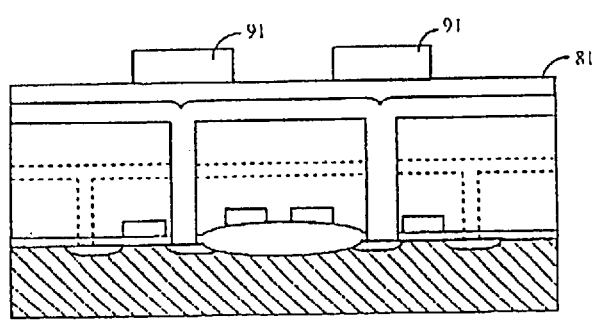

A resist layer 91 is then formed on the polycrystalline silicon layer 81 and is patterned such that portions thereof above the storage electrode mentioned below, as shown in FIG. 3(E).

Figure 3F:
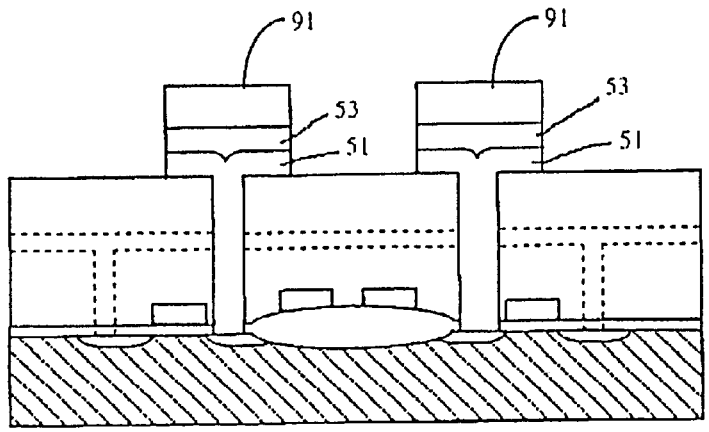

Then, the polycrystalline silicon layers 81 and 71 are etched using the resist layer 91 as a mask, as shown in FIG. 3(F). The second intermediate insulating layer 11 which is composed of a different material than the polycrystalline silicon layers functions as an etching stopper, due to a difference in etch selectivity. Then, the resist layer 91 is removed, and the storage electrode which comprises the first silicon layer 51 and the second silicon layer 53 is formed.

Figure 3G:
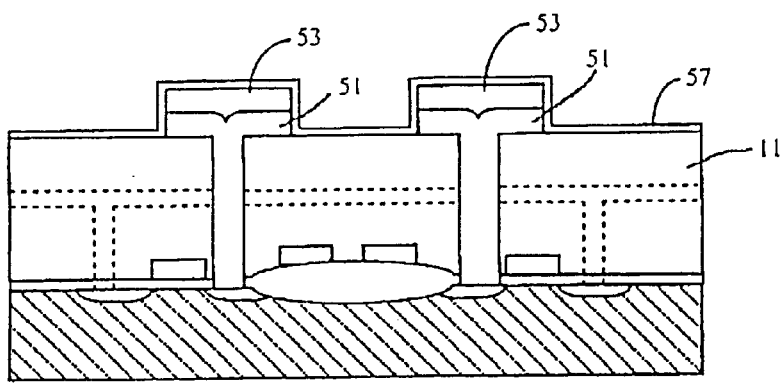

Then, an dielectric layer 51, in this embodiment a nitride layer, is formed on the second insulating layer 11 and on the sides and upper surfaces of the first and second silicon layers 51 and 53, as shown in FIG. 3(G).

Figure 3H:
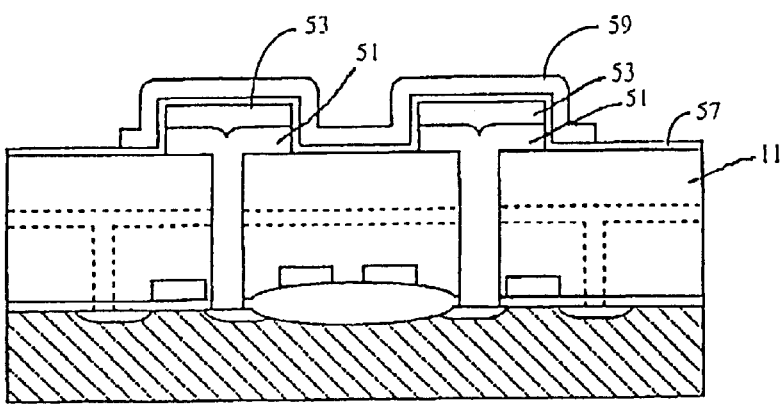

Then, a polycrystalline silicon layer 59 is formed on the nitride layer 57 and is patterned to form a cell-plate electrode, as shown in FIG. 3(H).

After forming other insulating layers and conductive lines (not shown in the figures), the semiconductor device mentioned above is completed.

According to the first preferred embodiment of the present invention, as the lower portion of the storage electrode, that is the first silicon layer 51, includes the conductive impurity which is less than that of the upper portion of the storage electrode, diffusion of the impurities of the silicon layer of the storage electrode is restrained. Especially, it is difficult for the impurity introduced in the upper portion of the storage electrode (that is the second silicon layer 53 in this embodiment) to diffuse into the diffusion region 3 of the substrate 1.

In this embodiment, the first and second silicon layers are used to form the storage electrode. However, a single silicon layer may be used as the storage electrode, in which case a conductive impurity could be introduced into the single silicon layer so as to be unevenly distributed such that most of the impurity exists in the upper portion of the single silicon layer.

According to the invention, as the difference in the concentration of the impurities which are introduced in the silicon layers is relatively easy to achieve, the addition of many new process steps is not necessary.

If the first and second silicon layers 51 and 53 are comprised of the same material, for example a polycrystalline silicon, the process steps are complex, compared with using different materials.

According to the present invention, it is possible to provide a semiconductor device which is capable of reducing adverse influences to the characteristics of the transistors and secure a predetermined data-retention-time.

Further, it is possible to realize a method of manufacturing such a semiconductor device without the addition of many process steps.

The first embodiment is described relative to the capacitor of the DRAM. The present invention can also be applied for the structure of the gate electrodes of transistors.

Figure 4:
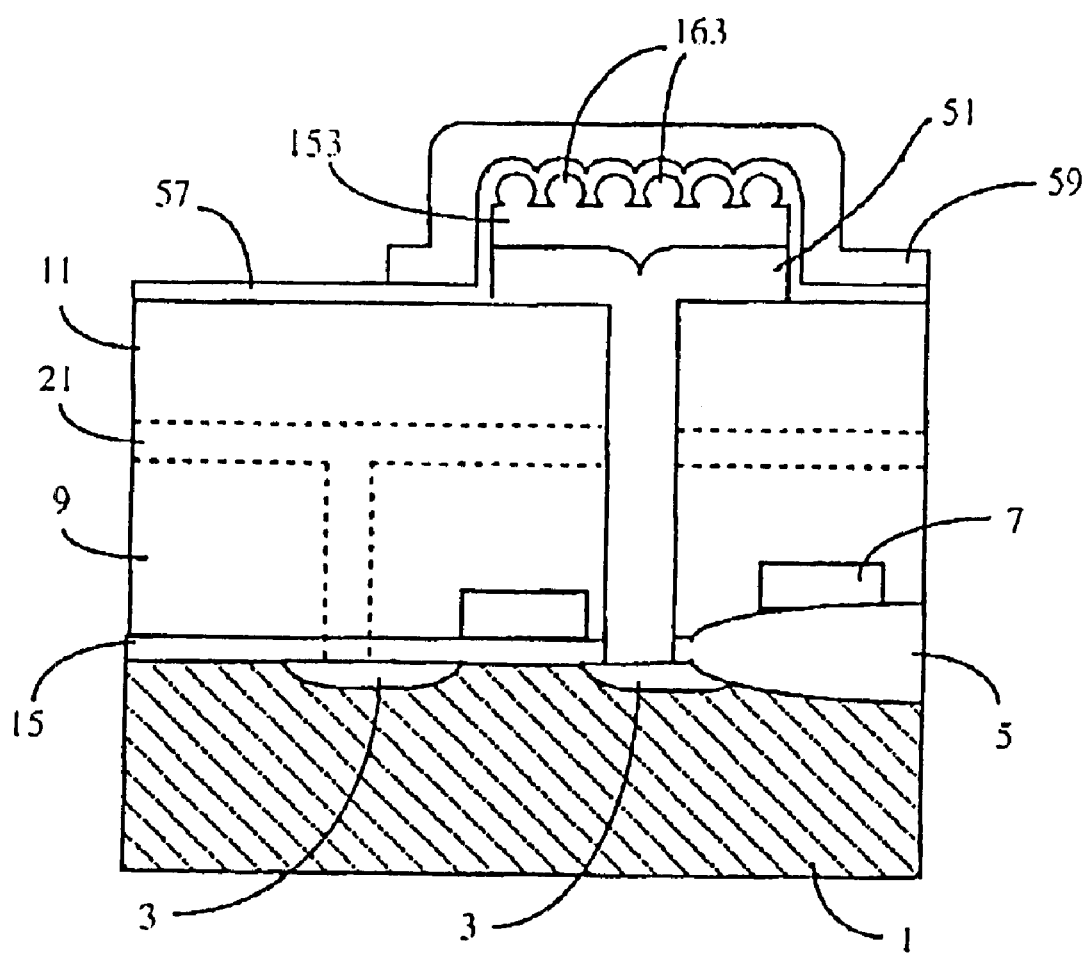
FIG. 4 is a cross-sectional view describing a semiconductor device according to a second preferred embodiment.

FIG. 4 is a cross-sectional view describing a memory cell of the DRAM according to a second preferred embodiment. In this embodiment, elements which correspond to the elements of the first preferred embodiment are marked with the same symbols to facilitate understanding.

In the second preferred embodiment, the surface of the second silicon layer 153 is roughened. That is, the second silicon layer 153 of the storage electrode has a rugged surface 163. Also, the nitride layer 57 formed on the rugged surface 163 has a configuration which according to the rugged surface 163.

According to this embodiment, as an effective surface area can be increased, the capacitance of the capacitor is increased, compared with the first preferred embodiment. Therefore, a sufficient capacitance which can restrain a soft error in the DRAM is realized.

Figure 5A:
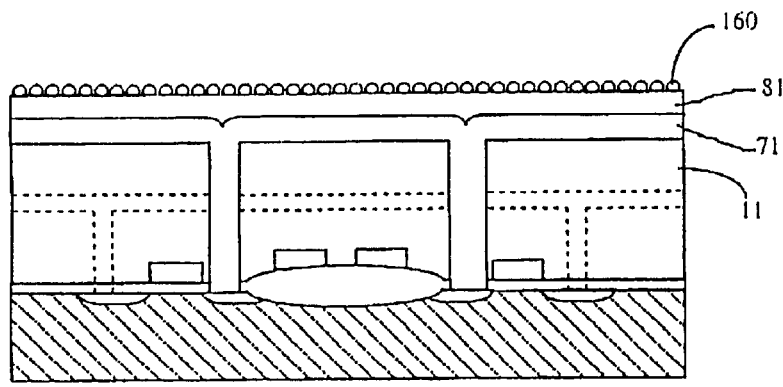
FIG. 5(A)–FIG. 5(C) are cross-sectional views describing a method of manufacturing the semiconductor device shown in FIG. 4.

A method of manufacturing the second embodiment will be shown hereinafter referring to FIG. 5. The explanation below will be focused in the forming of the rugged surface. Before the step of FIG. 5(A), steps similar to those of FIG. 3(A)–FIG. 3(D) are carried out.

After forming the second silicon layer 81 which is introduced the impurity (phosphorous) on the first silicon layer 71, a rugged polycrystalline silicon layer 160 is formed on the second silicon layer 81. The thickness of the rugged polycrystalline silicon 160 is 500–1000 Å. The rugged polycrystalline silicon layer 160 can be formed in an atmosphere which is introduced with silane SiH4 at a temperature of 560–580° C. Then an anneal treatment is carried out, and the rugged polycrystalline silicon layer 160 becomes conductive. Also, after forming the storage electrode by patterning, the patterned surface of the polycrystalline silicon layer 81 can be roughened.

Figure 5B:
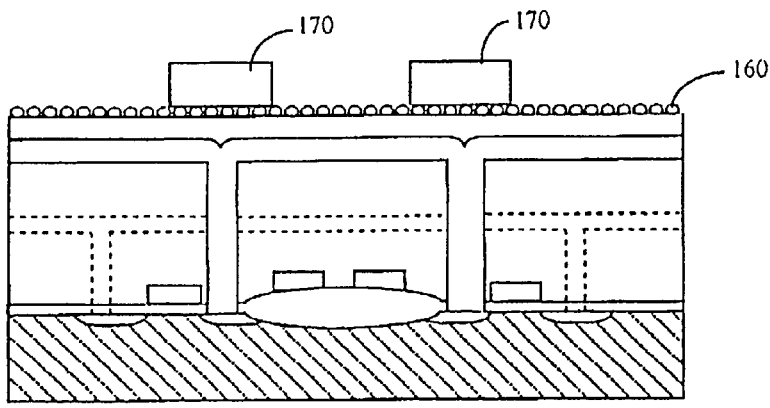

A resist layer is formed on the rugged polycrystalline silicon layer 160 and is patterned such that a part of the resist layer 170 remains above the storage electrode, as shown in FIG. 5(B).

Figure 5C:
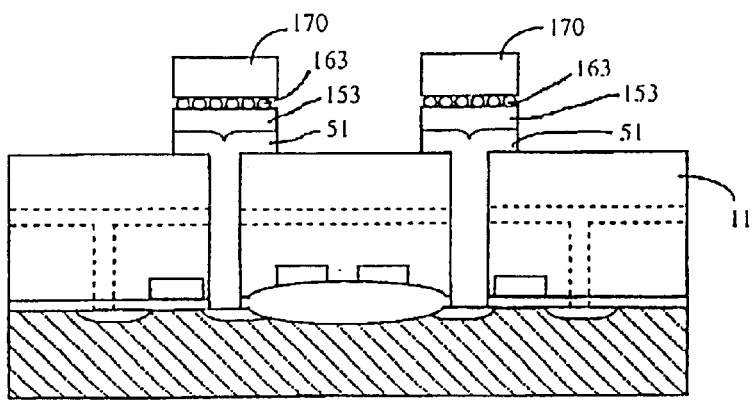

Then, the rugged polycrystalline silicon layer 160 and the polycrystalline layers 81 and 71 are etched using the resist layer 170 as a mask, as shown in FIG. 5(C). At this step, the second intermediate insulating layer 11 which is composed of a different material than the polycrystalline silicon layers functions as an etching stopper, due to the difference in etch selectivity. Then, the resist layer 170 is removed and the storage electrode which comprises the first silicon layer 51, the second silicon layer 153 and the rugged surface 160 is formed.

Then, the nitride layer 57 is formed on the second insulating layer 11 and on the sides and upper surfaces of the first and second silicon layers 51 and 153. In this embodiment, the nitride layer 57 is formed on the rugged surface 163 so as to correspond to the rugged surface 163. After this step, the description on the first embodiment can be referenced.

According to the second embodiment, by the addition of the step which forms the rugged surface, an increased capacitance can be realized.

As the rugged surface 163 is formed by the same material (polycrystalline silicon), the adherence between the rugged surface 163 and the silicon layer 153 is efficient. Using the same material reduces the process become complexity, compared with using different materials.

FIG. 6 is a cross-sectional view describing a memory cell of the DRAM according to a third preferred embodiment. In this embodiment, elements which correspond to the elements of the first preferred embodiment are marked the same symbols to facilitate understanding.

A side wall layer 201 is formed on the sides of the first and second insulating layers in the contact hole which is filled with the first silicon layer.

The side wall layer 201 is comprised of a polycrystalline silicon which is not introduced with a conductive impurity. The side wall 201 makes it possible to form a contact hole having a small width than that which is obtainable by an optical aligner.

Also, the side wall 201 can be comprised of an oxide layer or a nitride layer. If a part of the gate electrodes 7 located in the vicinity of the contact hole is exposed in the contact hole during formation of the contact hole, the exposed part of the gate electrodes could be covered by the insulating side wall 201. As such, a short circuit between the gate electrode and the storage electrode is prevented.

A method of manufacturing the third embodiment will be shown hereinafter referring to FIG. 7. The explanation below will be focused on forming the side wall 201. Before the step of FIG. 7(A), steps which corresponds to the steps of FIG. 3(A)–FIG. 3(B) are carried out.

After the etching step using a resist layer 211 (corresponds to the resist layer 60) as a mask shown in FIG. 3(B), a protection layer 213 is formed in the contact hole and on the resist layer 211. The protection layer 213 is formed using a CVD method and the thickness is 1000–3000 Å, as shown in FIG. 7(A).

Then, the protection layer 213 is etched by anisotropic etching and the side wall 201 remains on the side of the contact hole, shown in FIG. 7(B). Then the resist layer 213 is removed. After this step, the description of the first embodiment can be referrenced.

The resist layer 211 can be removed before forming the protection layer 213. If the material of the side wall 201 is the same as the second insulating layer 11, however, it is necessary for the resist layer 211 to remain to protect the second insulating layer 11 during etching of the protection layer 213.

Figure 8:
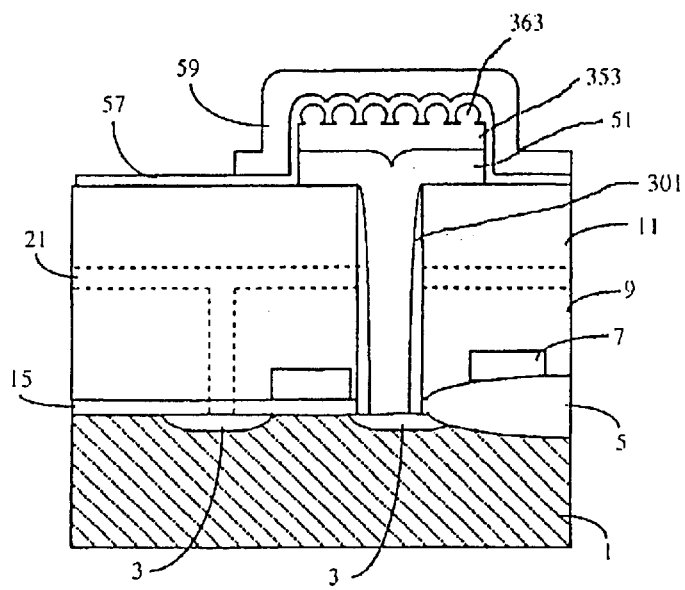
FIG. 8 is a cross-sectional view describing a variation of the third preferred embodiment.

The third embodiment can be applied to the second embodiment. The resultant structure is shown in FIG. 8. In this combination, a side wall 301 is formed on the sides of the first and second insulating layers 9 and 11 in the contact hole. Also, a surface of the second silicon layer 353 is roughened to form a rugged surface thereon.

According to this combination, the effects of both the second and third embodiments can be obtained. A method of manufacturing of this combination can be understood easily from the description mentioned above.

Figure 9:
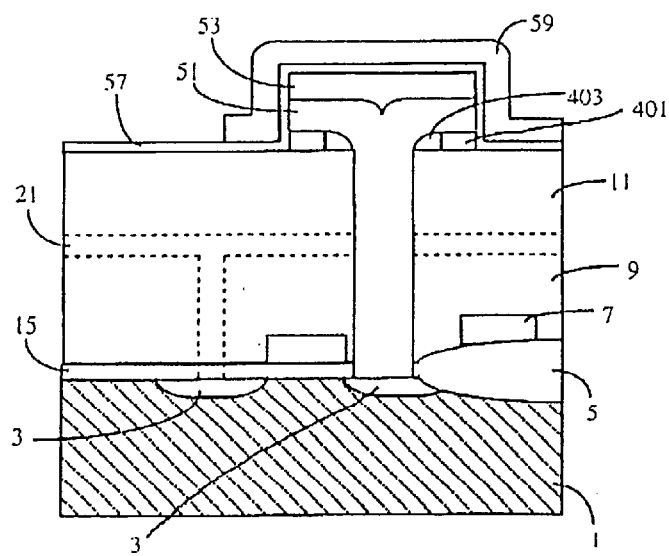
FIG. 9 is a cross-sectional view describing a semiconductor device according to a fourth preferred embodiment.

FIG. 9 is a cross-sectional view describing a memory cell of the DRAM according to a fourth preferred embodiment. In this embodiment, elements which correspond to the elements of the first preferred embodiment are marked with the same symbols to facilitate understanding.

A silicon layer 401 and a side wall 403 which both comprise a polycrystalline silicon is arranged between the second insulating layer 11 and the first silicon layer 51, as shown in FIG. 9.

According to the fourth embodiment, the contact hole CH2 can be formed using the silicon layer 401 and the side wall 403 as a mask. Therefore, it is possible to form a contact hole which has a smaller size than that obtained by an optical aligner, in addition to the effect which is obtained by the first preferred embodiment. Further, as the silicon layer 401 can be used as a part of the storage electrode, the capacitance may be increased according to the thickness of the silicon layer 401. The silicon layer 401 and the side wall 403 are not limited to polycrystalline silicon. However, it is preferable for adherence between layer 401, 403 and the first silicon layer 51 to sue the same material.

A method of manufacturing the fourth embodiment will be shown hereinafter referring to FIG. 10. The explanation below will focus on the forming of the silicon layer 401 and the side wall 404. Before the step of FIG. 10(A), the step of FIG. 3(A) can be referenced.

Figure 10A:
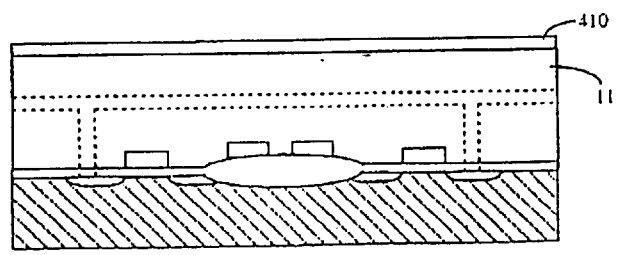
FIG. 10(A)–FIG. 10(I) are cross-sectional views describing a method of manufacturing the semiconductor device shown in FIG. 9.

A third polycrystalline silicon layer 410 for the silicon layer 401 is formed on the second insulating layer 11 using a CVD method, as shown in FIG. 10(A). The thickness of the polycrystalline silicon layer 410 is 1000–3000 Å. The polycrystalline silicon 410 may not be introduced with a conductive impurity. However, in this embodiment, the polycrystalline silicon 410 is introduced with the impurity (phosphorus) at a concentration of $2\times10^{20}/cm^3$–$5\times10^{20}/cm^3$.

Figure 10B:
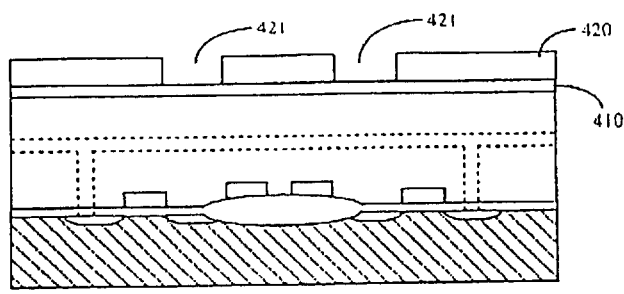

A resist layer 420 is formed on the polycrystalline silicon 410, with the resist layer 420 having an opening portion 421 which corresponds to the location of a storage electrode to be formed later, as shown in FIG. 10(B).

Figure 10C:
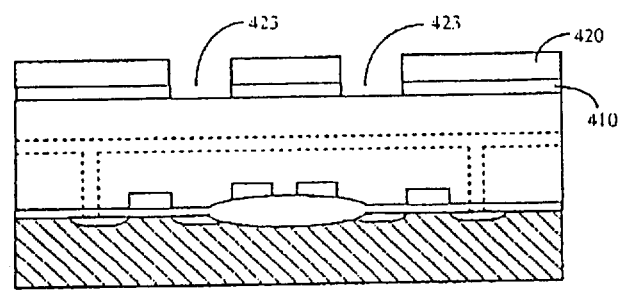
Figure 10D:
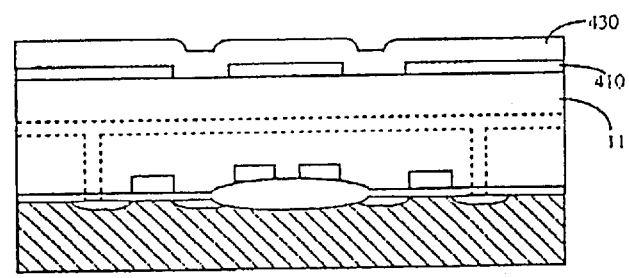

A part of the polycrystalline silicon 410 is etched using the resist layer 420 as a mask, and an opening 423 is formed in the polycrystalline silicon 410, as shown in FIG. 10(C).

A polycrystalline silicon layer 430 for the side wall 403 is deposited to fill in the opening 423 and is deposited on the polycrystalline silicon layer 410 using a CVD method. The thickness of the polycrystalline layer 430 is 1000–2000 Å. Similarly, the polycrystalline silicon 430 can be not introduced a conductive impurity or can be introduced the impurity (phosphorus) at a concentration of $2 \times 10^{20}/cm^3$–$5 \times 10^{20}/cm^3$.

Figure 10E:
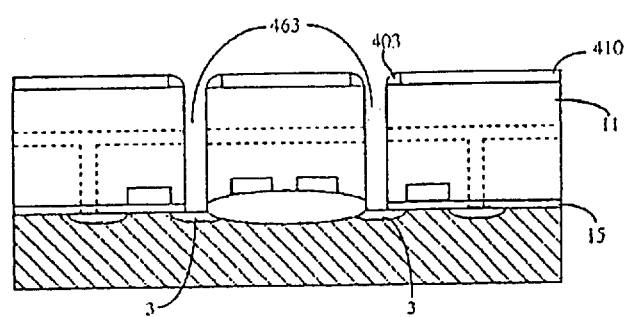

Then, the polycrystalline silicon layer 430 is etched by anisotropic etching and the side wall 403 remains on the side of the polycrystalline silicon layer 410, as shown in FIG. 10(E). The shoulder of the side wall 403 is sloped down. Then, the first and second insulating layers 9, 11 and a part of the gate oxide film 15 are etched by anisotropic etching using the polycrystalline silicon layer 410 and the side wall 403 as a mask. Consequently, a contact hole 463 is formed and reaches to the diffusion region 3. By the using the side wall 403 as a mask, a diameter of the contact hole 463 is less than that of the opening 423.

Figure 10F:
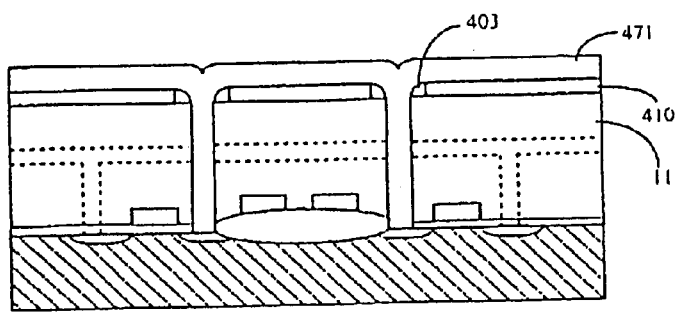

In FIG. 10(F), a polycrystalline layer 471 is deposited to fill in the contact hole 463 and on the polycrystalline silicon layer 410 and the side wall 403 using CVD method. It is possible to advance to the next step without introducing the impurity into the polycrystalline silicon 471. In this embodiment, the impurity, which has a concentration of $2 \times 10^{20}/cm^3$–$5 \times 10^{20}/cm^3$, is introduced into the polycrystalline silicon 471 in advance.

Figure 10G:
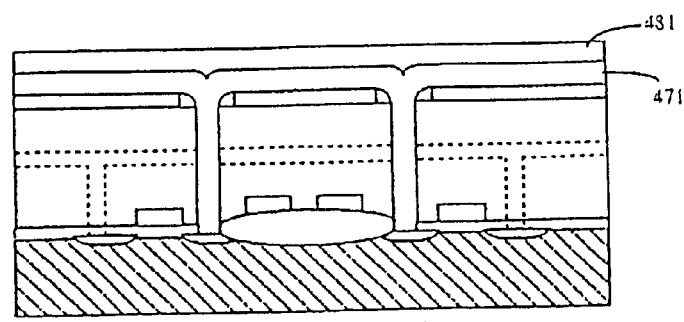

Then, a polycrystalline silicon layer 481 is formed on the polycrystalline silicon layer 471 as shown in FIG. 10(G). An impurity introduced in the polycrystalline silicon 481 is phosphorus (P). A concentration of this impurity is higher than that of the polycrystalline silicon layer 471.

Figure 10H:
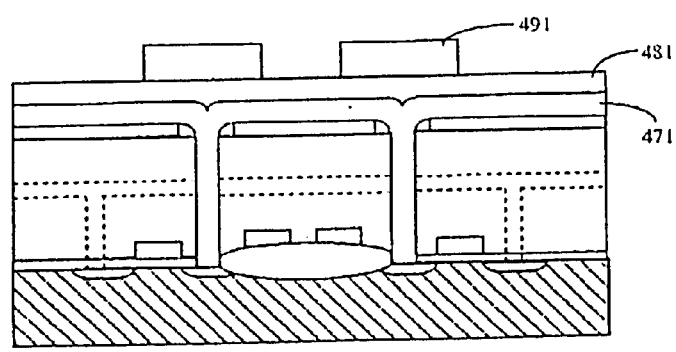

A resist layer is formed on the polycrystalline silicon layer 481 and is patterned such that a part of the resist layer 491 remains above a storage electrode, as shown in FIG. 10(H).

Figure 10I:
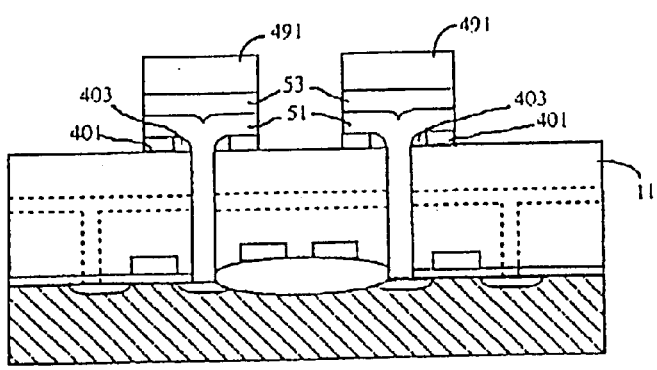

Then, the polycrystalline silicon layers 481, 471 and 410 are etched using the resist layer 491 as a mask, as shown in FIG. 10(I). At this step, the second intermediate insulating layer 11 which is composed of a different material than the polycrystalline silicon layers functions as an etching stopper, due to the difference in etch selectivity. Then, the resist layer 491 is removed and the storage electrode which comprises the first silicon layer 51, the second silicon layer 53, the silicon layer 401 and the side wall 403 is formed. After this step, the description of the first embodiment can be referenced.

According to the fourth embodiment, the silicon layer 401 and 403 can be used as a mask and a part of the storage electrode, and the capacitance may be increased according to the thickness of the silicon layer 401.

Figure 11:
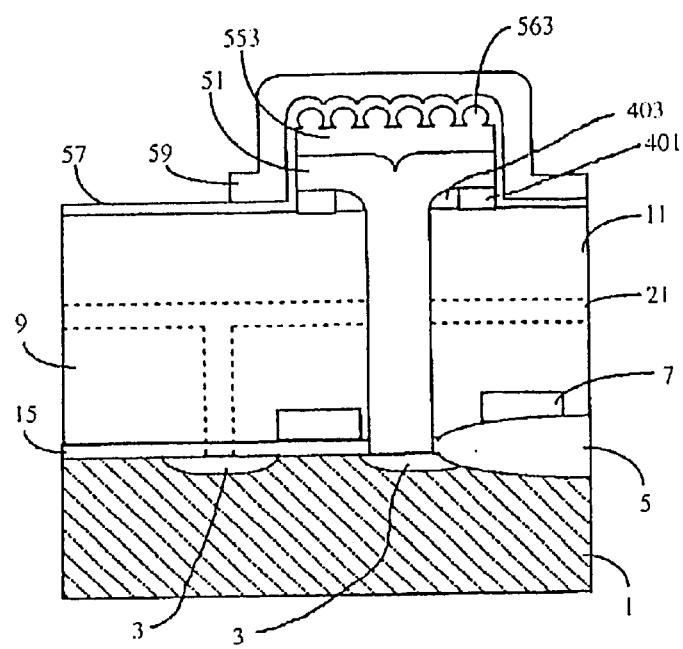
FIG. 11 is a cross-sectional view describing a variation of the fourth preferred embodiment.

The fourth embodiment can be applied to the second embodiment, and the resultant structure is shown in FIG. 11. In this combination, the silicon layer 401 and the side wall 403 is arranged between the second insulating layer 11 and the first silicon layer 51 and a surface of the second silicon layer 553 is roughened such that a rugged surface is formed thereon.

According to this combination, the effects of both the second and fourth embodiments mentioned above can be obtained. A method of manufacturing of this combination can be easily understood from the description above.

A conductivity type of the substrate and the diffusion region is not limited to the above embodiments and can be set flexibility.

The embodiments of the present invention are directed to the capacitor of a DRAM. The invention can also be applied to the gate electrodes and conductive lines.

Figure 12:
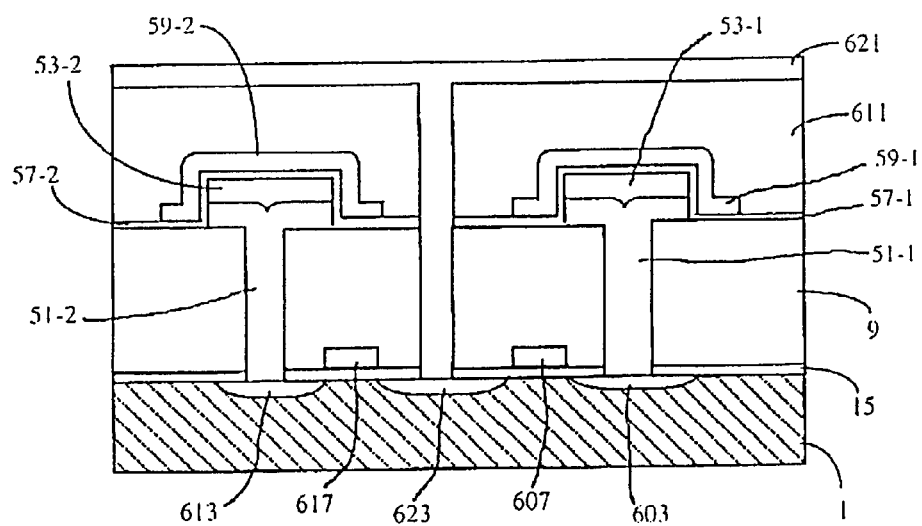
FIG. 12 is a cross-section view of another DRAM applied for the present invention.

It is possible to apply the invention to another DRAM, as shown in FIG. 12. FIG. 12 is a cross-sectional view describing a memory cell of the another DRAM.

Diffusion regions 603, 613, 623 (the source or drain of a transistor of the memory cell) are formed in a semiconductor substrate 1.

A gate oxide film 15 is formed on the surface of the substrate 1. Gate electrodes 607, 617 of the transistor of the memory cell are formed on the gate oxide film 15, which is located between the diffusion regions 3. A first intermediate insulating film 9 is formed on the gate oxide film 15 and the gate electrodes 607, 617.

A plurality of contact holes are formed in the first insulating layer 9. The silicon layer 51-1 is electrically connected to the diffusion region 603 through one of the contact holes. The first silicon layer 51-2 is connected to the diffusion region 613 through another one of the contact holes. Second silicon layers 53-1, 53-2 are respectively formed on the first silicon layers 51-1, 51-2. The first silicon layer 511 and the second silicon layer 53-1 compose one storage electrode. The first silicon layer 51-2 and the second silicon layer 53-2 compose to another storage electrode.

A nitride layer 57-1 is formed on the upper surface of the second silicon layer 53-1 and the side surfaces of the first and second silicon layers 51-1, 53-1. Similarly, a nitride layer 57-2 is formed on the upper surface of the second silicon layer 53-2 and the side surfaces of the first and second silicon layers 51-2, 53-2.

The silicon layer 59 is formed on the nitride layer 59 and covers the storage electrode through the nitride layer 57. The silicon layer 59 (cell plate electrode) is patterned in the vicinity of the storage electrode as shown in FIG. 1. The capacitance occurs in the dielectric layer (nitride layer 57) sandwiched between the storage electrode and the cell plate electrode, that is, between the side surface of the first silicon layer 51, the side and upper surfaces of the second silicon layer 53 and the silicon layer 59. Silicon layers 59-1, 59-2 are formed on the nitride layer 57-1, 57-2 and cover the storage electrodes through the nitride layer 57-1, 57-2, as shown in FIG. 12.

A second intermediate insulating layer 611 is formed on the nitride layers 57-1, 57-2 and the silicon layers 59-1, 59-2. A contact hole is formed through the first and second insulating layers 9, 611, to the diffusion region 3. A bit line 621 is formed on the second insulating layer 611 and is electrically connected to the diffusion region 623 through this contact hole.

The first silicon layers 51-1, 51-2, the second silicon layers 53-1, 53-2, and the silicon layer 59-1, 59-2 are comprised of polycrystalline silicon. The insulating layers 9, 611 are comprised of an oxide film or BPSG.

According to the structure shown in FIG. 12, the diffusion region 623 can be shared with two memory cells. Further, as the bit line is arranged on the capacitor, the design of bit lines becomes flexible.

Further, the invention can be applied to a fin type or a cylinder type capacitors.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. A semiconductor device including a transistor and a memory capacitor connected to the transistor comprising:

a semiconductor base having a principal surface;

source and drain regions of the transistor formed in the principal surface of the semiconductor base;

an insulating layer formed over the principal surface of the semiconductor base and having a contact hole aligned over either the source region or the drain region, a polycrystalline silicon layer formed over the insulating layer within the contact hole, wherein the polycrystalline silicon layer includes a lower polycrystalline silicon layer and an upper polycrystalline silicon layer, wherein the upper polycrystalline silicon layer is formed directly on the lower polycrystalline silicon layer, wherein a concentration of a conductive impurity in the upper polycrystalline silicon layer is higher than that in the lower polycrystalline silicon layer, wherein the lower polycrystalline silicon layer fills the contact hole and is located between the upper polycrystalline silicon layer and the insulating layer, and wherein edges of the lower polycrystalline silicon layer are substantially correspondent with edges of the upper polycrystalline silicon layer in a parallel direction with a channel between the source region and the drain region.

2. The semiconductor device according to claim 1, wherein the silicon layer is a storage electrode of a memory cell in a dynamic random access memory.

3. The semiconductor device according to claim 2, further comprising:

a dielectric layer formed on the upper surface of the upper polycrystalline silicon layer, wherein the dielectric layer is formed on the side surfaces of the lower polycrystalline silicon layer and the upper polycrystalline silicon layer; and a plate electrode layer which is comprised of polycrystalline silicon formed on the dielectric layer.

4. The semiconductor device according to claim 2, wherein a surface of the upper polycrystalline silicon layer is roughened in an atmosphere which is introduced with a silane at a temperature of 560–580° C.

5. The semiconductor device according to claim 4, further comprising a side wall layer formed on an interior surface in the contact hole, wherein the lower polycrystalline silicon layer is electrically connected to the impurity region.

6. The semiconductor device according to claim 5, wherein the concentration of the impurity in the lower polycrystalline silicon layer is within $2 \times 10^{20}/cm^3$ to $5 \times 10^{20}/cm^3$.

7. The semiconductor device according to claim 2, further comprising a side wall layer formed on an interior surface in the contact hole, wherein the lower polycrystalline silicon layer is electrically connected to the impurity region.

8. The semiconductor device according to claim 7, wherein the side wall layer has an inclined portion at an upper region of the contact hole.

9. The semiconductor device according to claim 8, wherein the concentration of the conductive impurity in the lower polycrystalline silicon layer is between $2 \times 10^{20}/cm^3$ and $5 \times 10^{20}/cm^3$.

10. The semiconductor device according to claim 1, wherein the concentration of the conductive impurity in the lower polycrystalline silicon layer is between $2 \times 10^{20}/cm^3$ and $5 \times 10^{20}/cm^3$.

11. The semiconductor device according to claim 1, wherein an interface between the lower polycrystalline silicon layer and the upper polycrystalline silicon layer is located outside the contact hole.

12. The semiconductor device according to claim 11, wherein the interface is equal to or higher than a surface of the insulating layer.

13. The semiconductor device according to claim 1, further comprising:

a dielectric layer formed on the upper surface of the upper polycrystalline silicon layer, wherein the dielectric layer is formed on the side surfaces of the lower polycrystalline silicon layer and the upper polycrystalline silicon layer; and a plate electrode layer which is comprised of silicon formed on the dielectric layer.

14. A semiconductor device comprising:

a semiconductor base having a principal surface;

first and second impurity regions formed in the principal surface of the semiconductor base;

an insulating layer formed over the principal surface of the semiconductor base and having first and second contact holes respectively aligned over the source region and the drain region;

a first polycrystalline silicon layer formed over the insulating layer within the first contact hole, wherein the first polycrystalline silicon layer includes a first lower polycrystalline silicon layer and a first upper polycrystalline silicon layer, wherein the first upper polycrystalline silicon layer is formed directly on the first lower polycrystalline silicon layer, wherein a concentration of a conductive impurity in the first upper polycrystalline silicon layer is higher than that in the first lower silicon layer, wherein the first lower polycrystalline silicon layer fills the first contact hole and is located between the first upper polycrystalline silicon layer and the insulating layer, and wherein edges of the first lower polycrystalline silicon layer are substantially correspondent with edges of the first upper polycrystalline silicon layer;

a second polycrystalline silicon layer formed over the insulating layer within the second contact hole, wherein the second polycrystalline silicon layer includes a second lower polycrystalline silicon layer and a second upper polycrystalline silicon layer, wherein the second upper polycrystalline silicon layer is formed directly on the second lower polycrystalline silicon layer, wherein a concentration of a conductive impurity in the second upper polycrystalline silicon layer is higher than that in the second lower polycrystalline silicon layer, wherein the second lower polycrystalline silicon layer fills the second contact hole and is located between the second upper polycrystalline silicon layer and the insulating layer, and wherein edges of the second lower polycrystalline silicon layer are substantially correspondent with edges of the second upper polycrystalline silicon layer;

a dielectric layer formed on the upper and side surfaces of the first and second upper polycrystalline silicon layers, wherein the dielectric layer is formed on the side surfaces of the first and second lower polycrystalline silicon layers; and a conductive layer which is comprised of silicon formed on the dielectric layer.

15. The semiconductor device according to claim 14, wherein the first and second polycrystalline silicon layers are storage electrodes of a memory cell in a dynamic random access memory.

16. The semiconductor device according to claim 15, wherein surfaces of the first and second upper polycrystalline silicon layers are roughened in an atmosphere which is introduced with silane at a temperature of 560–580° C.

17. The semiconductor device according to claim 14, wherein the concentration of the impurity in the first and second lower polycrystalline silicon layers are within $2\times10^{20}/cm^3$ to $5\times10^{20}/cm^3$.

* * * * *